United States Patent [19]

Heilveil et al.

[11] Patent Number: 5,163,024
[45] Date of Patent: Nov. 10, 1992

[54] VIDEO DISPLAY SYSTEM USING MEMORY WITH PARALLEL AND SERIAL ACCESS EMPLOYING SERIAL SHIFT REGISTERS SELECTED BY COLUMN ADDRESS

[75] Inventors: Andrew L. Heilveil, Austin; Jerry R. VanAken, Sugarland; Karl M. Guttag, Missouri City; Donald J. Redwine, Houston, all of Tex.; Raymond Pinkham, Santa Clara, Calif.; Mark F. Novak, Ypsilanta, Mich.

[73] Assignee: Texas Instruments Incorporated, Dallas, Tex.

[21] Appl. No.: 520,986

[22] Filed: May 9, 1990

Related U.S. Application Data

[63] Continuation of Ser. No. 160,054, Feb. 24, 1988, abandoned, which is a continuation of Ser. No. 567,110, Dec. 30, 1983, Pat. No. 4,747,081.

[51] Int. Cl.[5] .............................................. G11C 7/00
[52] U.S. Cl. ............................... 365/219; 365/230.09; 365/240; 340/799
[58] Field of Search ..................... 365/189.02, 189.12, 365/219, 230.02, 230.09, 240; 340/798, 799, 800

[56] References Cited

U.S. PATENT DOCUMENTS

| | | | |
|---|---|---|---|
| 3,577,086 | 5/1971 | Kliman et al. | 328/62 |
| 3,930,239 | 12/1975 | Salters et al. | 365/240 |
| 4,169,262 | 9/1979 | Schwartz et al. | 340/800 |
| 4,412,313 | 10/1983 | Ackland et al. | 365/240 |
| 4,429,375 | 1/1984 | Kobayashi et al. | 365/240 |
| 4,498,155 | 2/1985 | Mahan Rao | 365/240 |
| 4,541,075 | 9/1985 | Dill et al. | 365/219 |
| 4,562,435 | 12/1985 | McDonough et al. | 340/798 |

FOREIGN PATENT DOCUMENTS 52-124827 10/1977 Japan .

OTHER PUBLICATIONS

Electronic Design, Novak et al., pp. 183-188, Jul. 21, 1983, "Inside Graphic Systems, From Top to Bottom".
Electronic Design, Pinkham et al., pp. 161-171, Aug. 18, 19, 1983, "Video RAM Excels at Fast Graphics".

Primary Examiner—Joseph A. Popek
Attorney, Agent, or Firm—Richard B. Havill; Lawrence J. Bassuk; Richard L. Donaldson

[57] ABSTRACT

In a video-type computer system and the like, an improved memory circuit is provided for adapting the system to CRT screens having different resolutions. The memory circuit includes a bit-mapped RAM unit or chip having sufficient cells to accommodate any CRT screen sought to be used, and also a serial shift register having taps at a plurality of different locations corresponding to different columns of cells in the RAM unit. When the RAM unit is in serial mode, a row of data is transferred into the serial shift register. Then the column address applied to the RAM unit is used to instruct and actuate a suitable decoder circuit to select the tap appropriate to unload the portion of the serial shift register containing the data bits of interest.

32 Claims, 8 Drawing Sheets

VIDEO DISPLAY SYSTEM USING MEMORY WITH PARALLEL AND SERIAL ACCESS EMPLOYING SERIAL SHIFT REGISTERS SELECTED BY COLUMN ADDRESS

This is a continuation of application Ser. No. 07/160,054, filed Feb. 24, 1988 and now abandoned, which is a continuation of application Ser. No. 06/567,110, filed Dec. 30, 1983 and now U.S. Pat. No. 4,747,081.

This application contains subject matter disclosed in U.S. Pat. Nos. 4,639,890; 4,663,735; 4,688,197; and 4,689,741, all filed Dec. 30, 1983 and assigned to Texas Instruments Incorporated.

BACKGROUND OF INVENTION

This invention relates to electronic computer systems and the like, and more particularly relates to improved methods and apparatus for achieving a video display having high resolution.

It is conventional to present the output from a computer as an image on the screen of a cathode ray tube or the like. The screen is actually composed of a collection of dots or "pixels," and the image is therefore produced by selecting and illuminating those pixels necessary to form the desired image. If the image sought to be presented is merely a simplistic pattern of numbers or other symbols, this may be achieved with a relatively limited number of pixels. However, if a more complex image (with a greater resolution) is desired, then a screen must be chosen which has a substantially greater number of pixels.

Although computer output data may be collected and exhibited in various ways, video-type output displays are especially favored for so-called "home" computers and "game" or amusement devices which are directed to the residential market. Furthermore, the residential market has increasingly demanded that these games and home-type computers exhibit output images having greater resolution. On the other hand, the residential market for these games and home computers is also extremely price conscious in character.

It should be understood that each pixel used to form the image is illuminated by a separate output data signal from the processing section of the computer, and that an increase in resolution requires a screen having a greater number of pixels. More particularly, since each video data signal must also be stored before being transferred to the video screen, an increase in image resolution also requires that the data storage section have a corresponding increase in the number of memory cells for receiving and holding all of these data signals.

If a different screen having an increased number of pixels is employed for the purpose of enhancing the resolution of the image displayed on the screen, this will not by itself cause a disproportionate increase in the overall cost of the system. However, the size or capacity of the memory component or circuit is a significant factor in the cost of the system, and an increase in the resolution of the image being presented effectively decreases the time interval available to effect a transfer of each of the data signals between the storage and the video section.

There have been many attempts and proposals for overcoming or mitigating these disadvantages. In particular, a larger storage unit may be selected to accommodate the increased number of input signals, but as hereinbefore explained, such a unit is inherently expensive, and its use in a home computer system will disproportionately increase the costs of such computer systems. The technology is available to provide specially designed memory units capable of fast access for a higher data rate, but such units are even more expensive than slower access memory units.

Alternatively, an increase in data storage capacity may be achieved by simply adding additional memory units. However, this not only increases the overall cost of the system, since each memory unit is a separate storage component this tends to increase the length of the time required to transfer video data to the pixels.

It has been proposed to mitigate part of the problem which arises when the data storage is composed of a plurality of separate random-access memory units or "chips," by interconnecting them in parallel with a shift register, whereby all of the units may be unloaded and their contents transferred to the shift register at the same time. The data in the shift register is then sequentially clocked to the pixels at the proper video data rate. Although this technique has been extremely beneficial in reducing the data transfer cycle to that corresponding to a single memory chip, it does not attack the problem of increased cost. Moreover, since the storage circuit is composed of memory units of standard design, there will inherently be ore cells in the storage circuit than there are pixels on the video screen, and whenever the storage is unloaded into the video section, it is necessary to unload more cells than are actually required to produce the image.

These and other disadvantages of the prior art are overcome with the present invention, however, and novel means and methods are herewith provided for increasing the resolution of the image on the screen without a disproportionate increase in the overall cost of the computer system. Further, improved and novel means and methods are herewith provided for also reducing the time required to unload and transfer selected video data between the storage circuit and the video section of the computer system.

SUMMARY OF INVENTION

In a preferred embodiment of the present invention, wherein a cathode ray tube having a substantially greater number of pixels is sought to be employed, a suitable computer system may be provided with a bit-mapped memory unit having an appropriate number of cells in rows and columns, and also a serial shift register for interconnection in parallel with the columns of cells as hereinbefore explained. However, the shift register is also preferably provided with a plurality of taps at preselected bit locations, and a suitable decoder circuit is preferably included to select the tap relating to that portion of the shift register containing the data of interest.

In this arrangement, video data is generated by the processor section in a conventional manner, and is thereafter transferred into the appropriate cells in the storage by means of conventional row and column addresses. A row of video data may be unloaded, in parallel, into the shift register in a conventional manner. However, when the shift register is sought to be unloaded for transfer to the video circuit or section, the decoder circuit is actuated to select the tap corresponding to the portion of the shift register containing the data of interest, and only that portion is unloaded for transfer to the video screen.

It will be apparent that, if a conventional RAM unit is employed, the storage circuit will necessarily contain more cells than are necessary to produce the intended image. However, the taps on the shift register permit the unused portion of the storage to be excluded from the operation of the system, and this substantially reduces the time required for data transfer to an absolute minimum.

It will be immediately recognized that it is cheaper to employ a plurality of conventional dynamic RAM units as the storage circuit, than to employ a single memory unit of special design. Accordingly, the aforementioned taps further permit the computer system to be adapted to produce a video image of higher resolution, in a more economical manner, but employing the same transfer time.

Accordingly, it is an object of the present invention to provide an improved computer system with a video section presenting a higher resolution image.

It is also an object of the present invention to provide an improved video-type computer system having a reduced time for transferring selected video data to the video screen.

It is an additional object of the present invention to provide a memory subsystem for bit-mapped raster-scan video displays having a reduced amount of circuitry, and having minimum memory contention problems, to thereby provide the display processor more access time to the memory to update video data.

It is a further specific object of the present invention to provide an electronic computer system and the like, having an improved data storage circuit comprising a memory circuit composed of storage cells in electrically interconnected rows and columns, and a shift register circuit interconnectable therewith and having a plurality of taps at preselected bit positions therealong.

These and other objects and features of the present invention will become more apparent from the following detailed description wherein reference is made to the figures in the accompanying drawings.

IN THE DRAWINGS

DETAILED DESCRIPTION OF SPECIFIC EMBODIMENT

Figure 1:
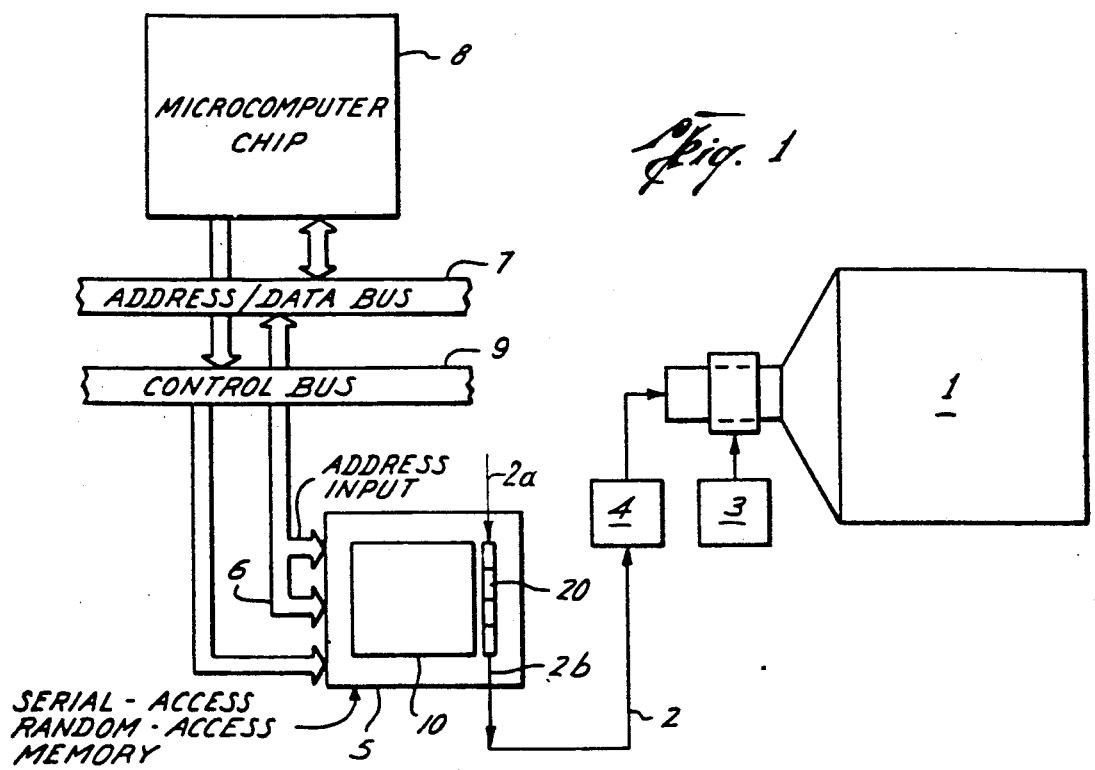
FIG. 1 is a simplified block diagram of a computer system embodying one form of the present invention.

Referring to FIG. 1, there may be seen a simplified representation of the components of a computer video system which employs a dual-port bit-mapped memory arrangement according to one embodiment of the invention. More particularly, there may be seen a video display section 1 having a conventional raster-scanned CRT tube responsive to a video signal input 2 consisting of serial bits of data arriving at a rate of about 20 MHz or greater.

The standard TV signal normally provides 60 data frames per second, with 512 interlaced lines per frame, and each such line may have several hundred dots or pixels. The product of these numbers indicates that data bits must be supplied to the CRT at frequencies of the order of 20 MHz. For a simple black and white picture, each dot or pixel can be defined by one data bit, but up to four bits may be required for images in a more realistic sixteen shades of gray. A full-color image may require three or four streams or planes of data and usually will require at least one byte (8-bits) per pixel.

The horizontal and vertical scanning and synchronizing circuitry 3 and video signal shaping circuitry 4 may be of a conventional design, and are not a functional part of the present invention. In addition, the circuitry depicted in FIG. 1 may also include a complete TV monitor or receiver as needed. However, the video data on input 2 is preferably received from a bit-mapped video memory 5 as will be described later herein, and this memory 5 will preferably have at least one cell for each corresponding pixel on the video screen 1. The memory 5 may conveniently have a "parallel" or random input/output port 6, port it may have separate parallel input and output ports, in addition to the serial input port 2a and serial output port 2b depicted in FIG. 1. In addition, port 6 is preferably coupled to a multiplexed address/data input/output bus 7 of a suitable microcomputer, or microprocessor, 8.

Referring again to FIG. 1, it will be noted that the memory 5 receives addresses appearing on the bus 7, to define the address for the serial ports 2a and 2b, and also to define addresses for writing into or reading from the memory 5, by way of the parallel or random port 6. A control but 9 coupling the microcomputer 8 to the memory 5 provides the basic clock frequency signal $\phi$ which clocks the serial video data onto the CRT input line 2, and which also provides the memory control signals such as Address Latch, Row Address Strobe ($\overline{RAS}$), Column Address Strobe ($\overline{CAS}$), Serial Select, Write Enable, etc., as may be required because of the characteristics of both the memory device 5 and microcomputer 8.

The memory 5 further includes a memory or storage array 10 composed of rows and columns of memory cells partitioned according to the size and type of video display 1 and the type of memory 5 which has been chosen. In addition, the memory 5 further includes a serial shift register 20 having a plurality of taps. In this regard, it will be noted that a standard two-level black and white TV raster conventionally requires about 512 rows of cells (for 512 lines) arranged in 512 columns (for 512 pixels per line), to accomodate a total of 256K-bits of memory per complete data frame. Accordingly, if 64K memory devices are used for these purposes, then four such units will be required to form the memory 5, or else one 256-K bit memory device may be used instead. These four units may alternate in feeding 256-bit blocks of video data serially onto the line 2, or other formats may be employed as appropriate. A black and white image having relatively low resolution may be produced using only one 64K-bit storage array capable of providing 256 lines by 256 pixels per line.

Figure 2:
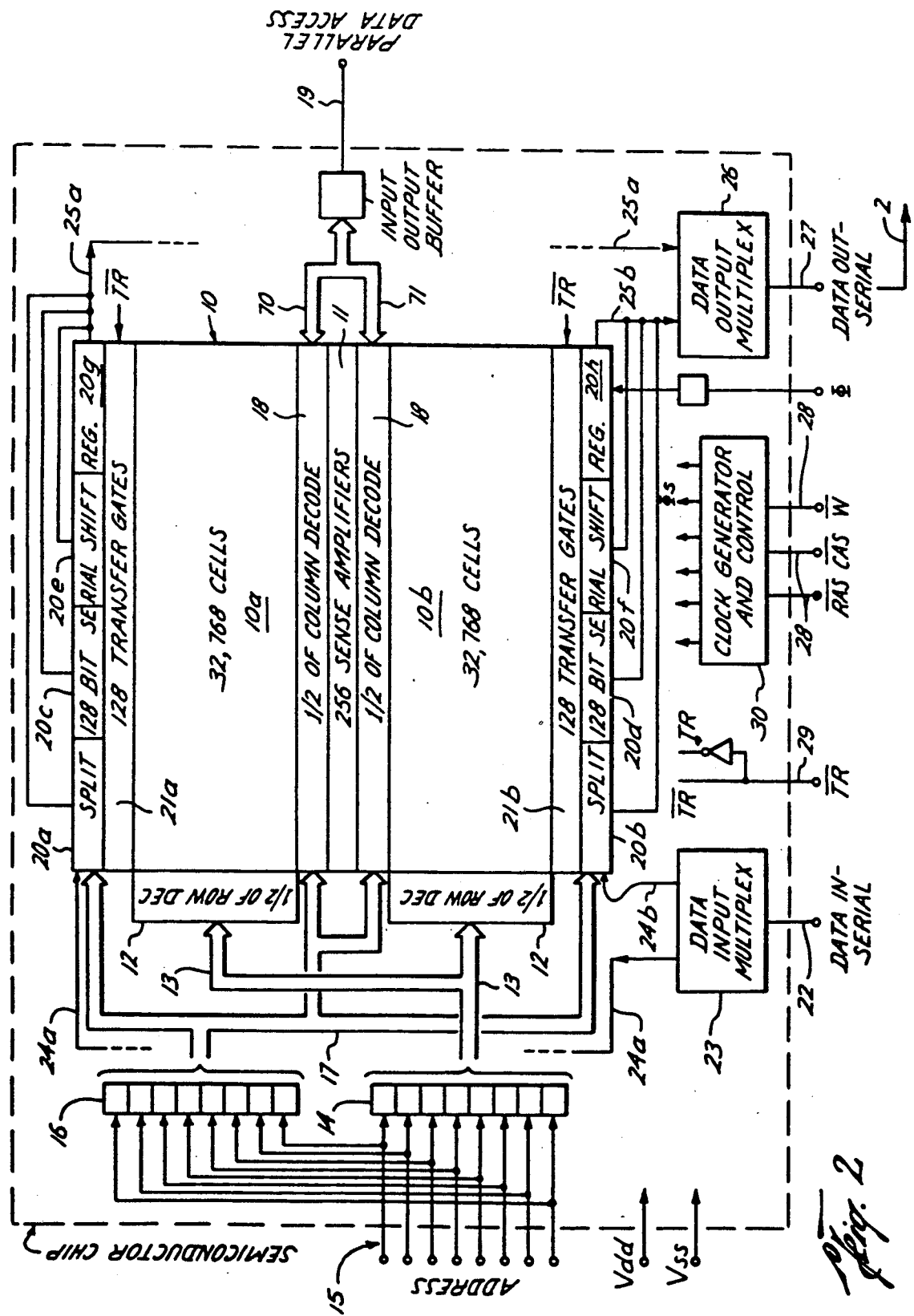
FIG. 2 is a more detailed block diagram of a selected portion of the computer system depicted in FIG. 1.

One example of a memory device 5 which may be suitable for use in the system depicted in FIG. 1 and depicted in FIG. 2, is a 64K-bit MOS dynamic read/-write memory using one transistor cells, as shown in U.S. Pat. No. 4,239,993, and further including a serial shift register having multiple taps added. For this example, the random access may be one bit wide. Other suitable examples (not shown) may be memory devices as hereinbefore described which have 256K-bits of storage or even larger.

As hereinafter set forth, if the memory is partitioned to provide eight chips, for example, then the individual storage devices may be X1, i.e. one bit wide, and eight of these storages may be connected in parallel for access by a typical 8-bit microcomputer 8. Other partitioning, such as ×4 or ×8, could also be employed as will hereinafter be apparent.

The memory device 5 depicted in FIG. 2 is typically made by an N-channel, self-aligned, silicon-gate, double-level polysilicon, MOS process, with all of the device being included in one silicon chip of about 1/30 of a square inch in size, which usually would be mounted in a standard dual-in-line package having twenty pins or terminals. For a 256K-bit device this package may be provided with as many as twenty-two pins or terminals. Similarly, the number of the pins would increase for larger volume devices. The device includes in this example an array 11-split into two halves 10a and 10b of 32,768 cells each, in a regular pattern of 256 rows and 256 columns. Of the 256 rows or X lines, there are 128 in the array half 10a and 128 in the half 10b. The 256 columns or Y lines are each split in half with one-half being in each of the halves 10a and 10b. There are 256 sense amplifiers 11 in the center of the array; these are differential type bistable circuits made according to the invention disclosed and claimed in said U.S. .t. No. 4,239,993, or in U.S. Pat. No. 4,081,701. Each sense amplifier is connected in the center of a column line, so 128 memory cells are connected to each side of each sense amplifier by a column line half. The chip requires only a single 5V supply $V_{dd}$, along with a ground terminal $V_{ss}$.

A row or X address decoder 12, split into two halves, is connected by sixteen lines 13 to eight address buffers or latches 14. The buffers 14 are made according to the invention disclosed in U.S. Pat. No. 4,288,706. An eight-bit X address is applied to inputs of the address buffers 14 by eight address input terminals 15. The X decoder 12 functions to select one of the 256 row lines as defined by an eight bid address on the input terminals 15 received via bus 7 from the microcomputer 8. For more than 256 row lines, i.e. a 256 K-bit memory with 512 row lines, a larger than eight-bit X address and latch must be employed.

Figure 3:
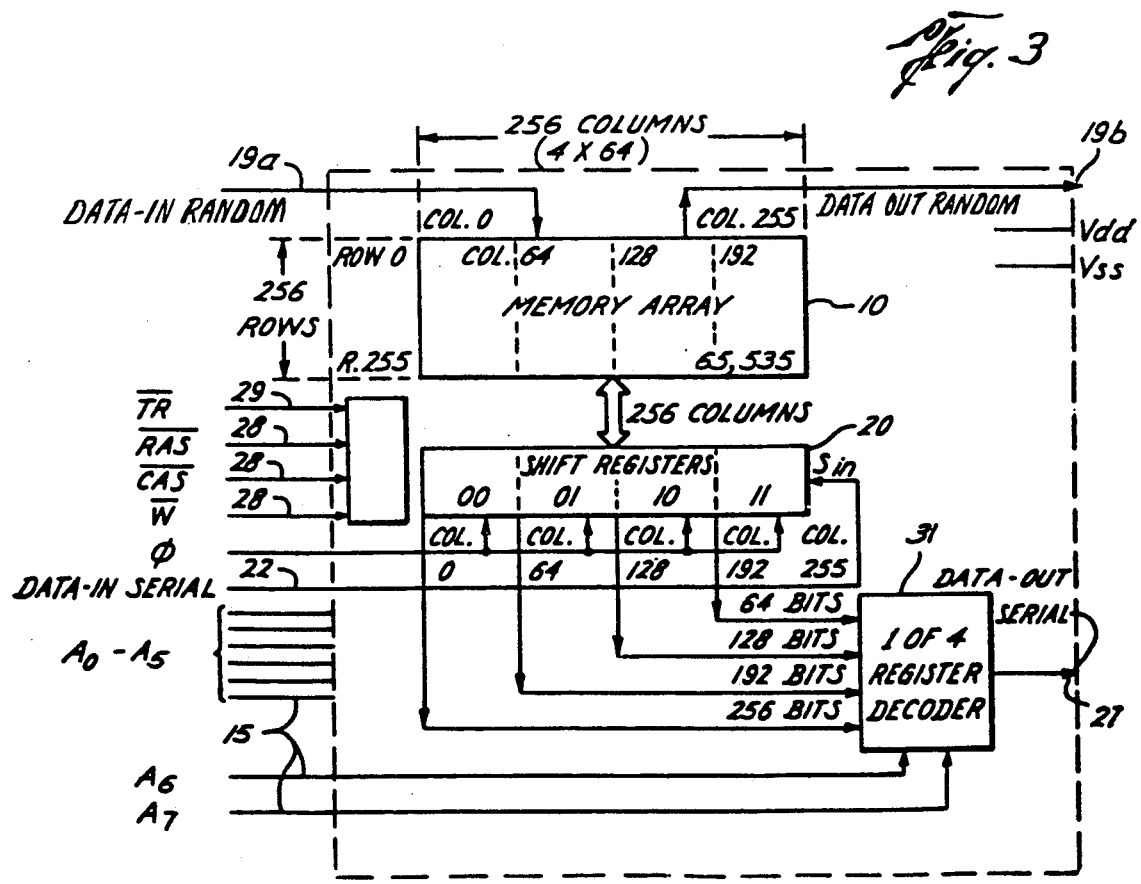
FIG. 3 is another different block diagram of the apparatus depicted FIG. 2.

A column address is also received on the input pins 15 and latched into column address latches 16. For a bit-wide random-access data input/output, all eight column address bits are needed, but for byte-wide access, i.e. eight bits, only five address bits are needed, and the microcomputer may output additional column address bits to select among several cascaded chips; these additional column address bits may be used by chip-select decoders of conventional construction. The outputs of the column address latches 16 are connected by lines 17 to a decoder 18 in the center of the array which selects one-of-256 columns to produce a bit wide input/output on random access input/output line 19; separate input 19a and output 19b lines may be used as shown in FIG. 3, or the line 19 may be multiplexed as shown in FIG. 2. Rows of dummy cells (not shown) are included on each side of the sense amplifiers as is the usual practice in devices of this type. As for the Y-address, for larger volume devices, the number of bits and latches required to identify a column increases.

The memory device is thus similar to a standard dynamic RAM, with bit-wide or other bit-size random access and also having a serial input/output. Continuing to refer to FIG. 2, the serial access is provided by a 256-bit serial shift register 20 split into two identical halves with the halves positioned at opposite sides of the array 10. The same result may be achieved by placing both halves on the same side of the array, but laid out one above the other.

The serial shift register 20 may be loaded from the column lines of the array 10 for a read cycle, or loaded into the column lines for a write cycle, by 128 transfer gates 21a on one side of the array and a like number of transfer gates 21b on the other side of the array.

Data input to the device for serial write is by a data-in terminal 22 which is received connected by a multiplex circuit 23 to inputs 24a and 24b of the serial shift register halves. Data is read out serially from the register halves via outputs 25a and 25b, a data-out multiplex and buffer circuit 26, and a data-out terminal 27.

The serial shift register 20 is operated by a clock $\phi$ which is used to shift the bits through the stages of the register, two stages for each clock cycle. For read operations it takes only 128 cycles of the clock $\phi$ to output 256 bits from the 256 bit positions of the split serial shift register. A control signal $\overline{TR}$, on lead 29 and applied to the transfer gates 21a and 21b, connects each of the 256 bit positions of the serial shift register 20 to its corresponding column line in the array halves 10a and 10b.

In a serial write operation, the sense amplifiers 11 are operated by a write command, $\overline{W}$, occurring after $\overline{TR}$ to set the column lines at a full logic level, after which one row line is selected by the address in the latches 14 and the data forced into the memory cells of this row.

A serial read cycle starts with an address on the input pins 15 which is decoded to activate one of the 256 X or row address lines (and a dummy cell on the opposite side). The sense amplifiers 11 are then actuated by a control signal from clock generator and control circuitry 30 to force the column lines to a full logic level, and then the transfer gates 12a and 21b are actuated by control signal $\overline{TR}$ to move the 256 bits from the selected row into the corresponding serial shift register 20 halves. The shift clock signal is then applied and may move 256 bits onto the output pin 27 in serial format via the multiplex circuit 26, at two stages or bits per clock cycle, requiring 128 clock cycles for the entire serial shift register. The output pin 27 is connected to the video input 2 of FIG. 1.

In view of the foregoing discussion of the shift clock rate, it is obvious that the serial shift register 20 also can operate at half the described rate and take 256 clock cycles to input or output 256 bits of data.

As thus far described, the memory device is similar to a standard dynamic RAM with a bit-wide or other bit-size random access with a serial input and output; however, according to the invention, the 256-bit serial shift register 20, which provides the serial input and output, is organized as four 64-bit serial shift registers. One, two, three or four 64-bit serial shift registers may be accessed depending upon which of the four "taps" along the 256-bit serial shift register is selected. Since the 256-bit serial shift register is split into two "halves", each 64-bit serial shift register is also split into halves. As shown in FIG. 2, one 64-bit serial shift register includes top half 20a and bottom half 20b, a second 64-bit serial shift register includes top half 20c and bottom half 20d, a third 64-bit serial shift register includes top half 20e and bottom half 20f, and a fourth 64-bit serial shift register includes top half 20g and bottom half 20h.

The tap selected determines whether one, two, three or all four 64-bit serial shift registers are accessed. The tap selected is determined by a two bit code applied to the two most significant column address inputs. The depiction in FIG. 2 is thus made of lines 17 from the column address latch 16 also inputting to the serial shift register 20 to select, via the two bit binary code, the particular tap desired.

Referring now to FIG. 3, the selection of the tap and the operation of the four 64-bit serial shift registers may be clearly understood. The memory array 10 is therefore seen to be divided into four 64 column by 256 row arrays. The four sets of 64 columns correspond to the four 64-bit serial shift registers. It may also be clearly seen that this memory device operates as if it were two devices, i.e., a 256 rows by 256 columns, random access array 10, having a random input 19a and random output 19b, and an up to 256 by one array (i.e. the serial shift register 20) having a serial input 22 and serial output 27. This device allows access to the random array while serial data is being clocked into or out of one, two, three or four of the 64-bit serial shift registers. The register decoder 31 of FIG. 3 is of conventional construction. In this manner any bit of data may be accessed in 64 shifts or less, rather than 256 shifts. This may be of particular importance in other specific video applications.

Again, the tap selected is determined by a binary code, as illustrated in FIG. 3, which is applied to the two most significant column address inputs A6–A7. These inputs feed into the 1 of 4 register decoder 31 as shown in FIG. 3, to determine whether one, or two, or three or all four serial shift registers are accessed.

For example, if the two bits are both 0, then all 256 bits in the serial shift register may be shifted out. If the two bits are 01, then 192 bits, starting at bit 64, may be shifted out. If the two bits are 10, then 128 bits, starting at bit 128, may be shifted out. The two bit code 11, selects the last 64 bits starting at bit number 192 and then these last 64 bits may be shifted out.

Although FIG. 3 depicts four 64-bit serial shift registers, this invention is not so limited to equal division of the 256-bit serial shift register nor is it limited to four or less taps along this 256-bit serial shift register. In general, the number of bit positions between any two adjacent taps is a power of 2 that is less than and a different power of 2 from that power of 2 which equals the number of bit positions in the serial shift register. Further, this invention is contemplated for use in 512 rows by 512 columns or 1024 rows by 1024 columns, or larger devices having corresponding 512-bit or 1024-bit or larger serial shift registers in the manner described hereinbefore. Larger numbers of taps than four taps, will correspondingly require a larger register register decoder and more inputs into the decoder via the most significant column address lines, and conversely for fewer than four taps.

By use of these "taps" along the serial shift register it is possible to manufacture a 1024 rows by 1024 column (1 M-bit) device that may be used with many different CRT screens, i.e., screens of various sizes (525 lines by 512 pixels per line, or 300 lines by 720 pixels per line), by merely employing the appropriate taps along the serial shift register of the device. Thus, all 1024 bits do not have to be shifted out of the register to obtain the desired data bits at the "end" of the register. Further, the taps could be located at bit positions of the register corresponding to the number of pixels per line in a "standard" CRT that does not correspond to a power of 2 position as described hereinabove.

Figure 4:
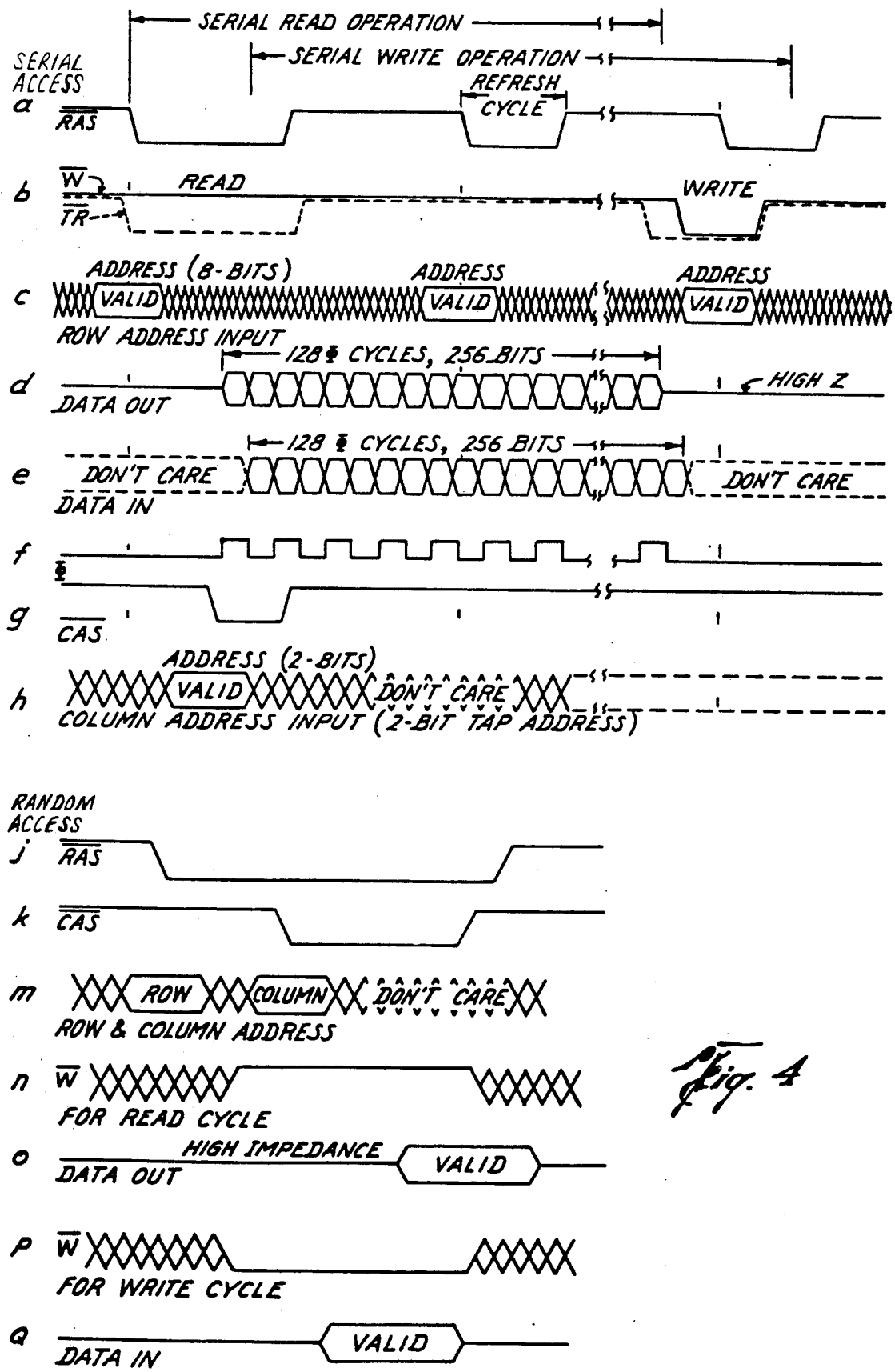
FIGS. 4(a-q) is simplified time-dependent representations of certain signals generated for operation of the apparatus depicted in FIG. 2.

Referring now to FIGS. 2 and 4 for both serial access and random access, the X or row address must appear on the inputs 15 when a row address strobe $\overline{RAS}$, seen in FIGS. 4a and 4i, is applied to a control input 28. A column address strobe $\overline{CAS}$, as seen in FIGS. 4g and 4k, and write command W as seen in FIGS. 4b, 4n and 4p are other controls 28 that may be employed during serial and random access to the devices. These external control inputs 28 are applied to clock generator and control circuitry 30 which generates a number of clocks and internal chip control signals to control the operation of various parts of the device.

For example, in serial access operations represented by the timing diagram of FIGS. 4a through 4h, when $\overline{RAS}$ goes low as seen in FIG. 4a, clocks derived from $\overline{RAS}$ cause the buffers 14 to accept and latch the eight row address bits then appearing on the input lines 15. The row address must be valid during the time period shown in FIG. 4c, i.e. during the falling edge of $\overline{RAS}$. Serial access is controlled by a $\overline{TR}$ command on control input 29. For a serial read operation, $\overline{TR}$ goes to active-low and the write command W is held high during the period seen in FIG. 4b, and the data output on the serial output terminal 27 will occur during the time period of 128 cycles seen in FIG. 4d. For a serial write operation, the $\overline{TR}$ and write command $\overline{W}$ must both be active-low as also seen in FIG. 4b and the data-in bits must be valid during the preceeding time period of 128 cycles seen in FIG. 4e.

Refresh occurs every time a row address appears on the inputs 15 and $\overline{RAS}$ goes low, as seen in FIG. 4a and 4c. Thus, during the 128 cycles when all four serial shift register halves are being read out through serial data-out pin 27, refresh can be occurring by loading a new row address into the chip 5 along with a $\overline{RAS}$ signal. The serial shift register is not disturbed so long as $\overline{TR}$ does not occur. Serial data can be shifted into the register halves while data is being shifted out, and so a serial write operation can begin just after a serial read operation is initiated; although not needed in the system of FIG. 1, this feature is important for some other embodiments.

Parallel or random access occurs as illustrated in the timing diagram of FIGS. 4j–4q; note that these Figures are on an expanded time scale compared to FIGS. 4a–4h. The X or row address of FIG. 4m must appear on the inputs 15 when a row address strobe signal $\overline{RAS}$ of FIG. 4j is applied to an input 28. Likewise, the Y or column address of FIG. 4m must appear during a column address strobe signal CAS of FIG. 4k on another input 28. A write command W of FIGS. 4n and 4p on an input 28 is the other control signal for the parallel or random access. When $\overline{RAS}$ goes low as seen in FIG. 4j, clocks derived from $\overline{RAS}$ cause the buffers 14 to accept and latch the eight row address TTL-level bits then appearing on the input lines 15.

When $\overline{CAS}$ goes low as seen in FIG. 4k then clocks generated in the circuitry 30 cause the buffers 16 to latch the TTL-level column (or Y) address signals on the inputs 15. The row and column addresses must be valid during the time periods shown in FIG. 4m.

For a random access read cycle, the $\overline{W}$ signal on input 28 must be high during the period seen in FIG. 4n, and the output on the terminal 19 will be valid during the time seen in FIG. 4o. For a random access write-only cycle, the $\overline{W}$ signal must be low as seen in FIG. 4p and the input must be valid on terminal 19 during the time seen in FIG. 4q.

The memory device also may operate in a page-mode format. That is, the row address is kept the same and successive column addresses are strobed onto the chip. By holding the row address the same, the time required to st up and strobe a new row address for the same page is eliminated and thus the time required for a page-mode operation is less than for a bit-mode format, as described hereinbefore. Typically, for the example device, a bit-mode operation requires about 260 nsec, where as a page-mode operation requires only about 160 nsec.

The serial access via terminals 22 and 27 and shift register 20 is usually sequential in that the row address is incremented by one following the data transfer for each access. The video data is a continuous serial stream of 256-bit rows, one after the other, so the next row address, needed for serial access after the memory to shift register transfer occurs, will generally be the last row address plus one. In the simplest embodiment, the microcomputer 8 sends out the row addresses for serial read, so an address counter in the microcomputer 8 will be incremented after each serial read is commanded. However, this function may also be performed by special circuitry on the chip of FIG 2.

In contrast, the parallel access via terminal 19 is random rather than sequential and specific row and column addresses must be generated in the microcomputer 8.

Thus, the timing of the $\overline{TR}$, $\overline{W}$, $\overline{CAS}$ and $\overline{RAS}$ signals is different for serial reads and writes, and random reads and writes. The voltages and timing of these control signals are seen in FIGS. 4a-4h for serial operations and 4j-4q for random operations. To load the serial shift register or transfer its contents into the array, $\overline{TR}$ must be low during the falling edge of $\overline{RAS}$.

If write command $\overline{W}$ is held high during the falling edge of $\overline{RAS}$ then data in the columns of the selected row will be moved into the register by the transfer gates 21. The two bit tap address, see FIG. 4h, appearing on the most significant column address lines A6 and A7 when $\overline{CAS}$ goes low, see FIG. 4g, determines which of the four cascaded 64-bit serial shift registers will be connected to serial output 27. The serial shift clock $\phi$ see FIG. 4f, then shifts the data out of the serial shift register at the desired data rate in response to the frequency of the clock $\phi$.

If write command $\overline{W}$ is held low during the falling edge of $\overline{RAS}$, then data is transferred from the serial shift register to the array columns and into the row selected by the row address bits.

If $\overline{TR}$ is held high when $\overline{RAS}$ falls low then the serial shift register and array operate independent of each other, i.e., the serial shift register may shift data out or in and the array is available for random access.

Thus the timing of write command $\overline{W}$ is different in the random access mode and the serial mode of operation of the memory device. More specifically, write command $\overline{W}$ is set up and held relative to the falling edge of $\overline{CAS}$ during a random access operation. However, write command $\overline{W}$ is set up and held relative to the falling edge of $\overline{RAS}$ during a serial access operation.

Figure 5:
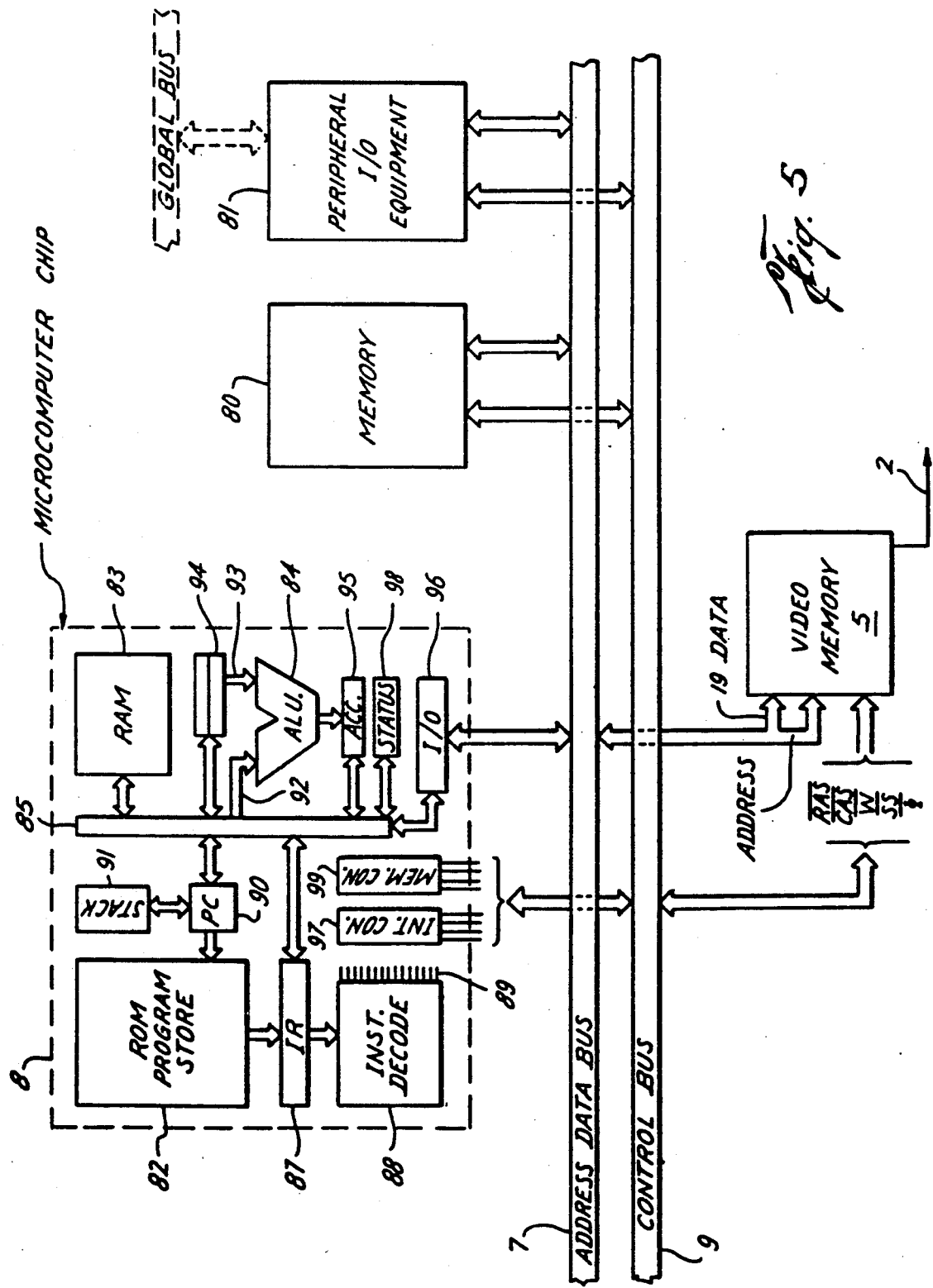
FIG. 5 is a block diagram of another portion of the system depicted in FIG. 1.

Referring to FIG. 5, a microcomputer which may be used with the system of the invention may include a single-chip microcomputer device 8 of conventional construction, along with additional off-chip program or data memory 80 (if needed), and various peripheral input/output devices 81, all interconnected by an address/data bus 7, and a control bus 9.

A single bidirectional multiplexed address/data bus 7 is shown, but instead separate address and data busses may be used, and also the program addresses and data or input and output addresses may be separated on the external busses; the microcomputer may be of the Von Neumann architecture, or of the Harvard type or a combination of the two.

The microcomputer 8 could be one of the devices marketed by Texas Instruments under the part number of TMS 7000, for example, or one of the devices commercially available under part numbers Motorola 6805, Zilog Z8 or Intel 8051, or the like. These devices, while varying in details of internal construction, generally include an on-chip ROM or read-only memory 82 for program storage, but also may have program addresses available off-chip, but in any event have off-chip data access for the memory 5.

A typical microcomputer 8, as illustrated in FIG. 5, may contain a RAM or random access read/write memory 83 for data and address storage, an ALU 84 for executing arithmetic or logic operations, and an internal data and program bus arrangement 85 for transferring data and program addresses from one location to another (usually consisting of several separate busses). Instructions stored in the ROM 82 are loaded one at a time into an instruction register 87 from which an instruction is decoded in control circuitry 88 to produce controls 89 to define the microcomputer operation.

The ROM 82 is addressed by a program counter 90, which may be self-incrementing or may be incremented by passing its contents through the ALU 84. A stack 91 is included to store the contents of the program counter upon interrupt or subroutine. The ALU has two inputs 92 and 93, one of which has one or more temporary storage registers 94 loaded from the data bus 85.

An accumulator 95 receives the ALU output, and the accumulator output is connected by the bus 85 to its ultimate destination such as the RAM 83 or a data input-/output register and buffer 96. Interrupts are handled by an interrupt control 97 which has one or more off-chip connections via the control bus 9 for interrupt request, interrupt acknowledge, interrupt priority code, and the like, depending upon the complexity of the microcomputer device 8 and the system.

A rest input may also be treated as an interrupt. A status register 98 associated with the ALU 84 and the interrupt control 97 is included for temporarily storing status bits such as zero, carry, overflow, etc., from ALU operations; upon interrupt the status bits are saved in RAM 83 or in a stack for this purpose.

The memory addresses are coupled off-chip through the buffers 96 connected to the external bus 7 depending upon the particular system and its complexity. This path may be employed for addressing off-chip data or program memory 80 and input/output 81 in addition to off-chip video memory 5. These addresses coupled to bus 7 may originate in RAM 83, accumulator 95 or instruction register 87, as well as program counter 90. A memory control circuit 99 generates (in response to control bits 89), or responds to, the commands to or from the control bus 9 for address strobe, memory enable, write enable, hold, chip select, etc., as may be appropriate.

In operation, the microcomputer device 8 executes a program instruction in one or a sequence of machine cycles or state times. A machine cycle may be 200 nsec., for example, established by an output from a 5 MHz crystal clock applied to the microcomputer chip. So, in successive machine cycles or states, the program counter 90 is incremented to produce a new address, this address is applied to the ROM 82 to produce an output to the instruction register 87 which is then decoded in the control circuitry 88 to generate a sequence of sets of microcode control bits 89 to implement the various steps needed for loading the bus 85 and the various registers 94, 95, 96, 98, etc.

For example, a typical ALU arithmetic or logic operation would include loading addresses (fields of the instruction word) from instruction register 87 via bus 85 to addressing circuitry for the RAM 83 (this may include only source address or both source and destination addresses). Such an operation may also include transferring the addressed data words from the RAM 83 to a temporary register 94 and/or to the input 92 of the ALU. Microcode bits 89 would define the ALU operation as one of the types available in the instruction set, such as add, subtract, compare, and, or, exclusive or, etc. The status register 98 is set dependent upon the data and ALU operation, and the ALU result is loaded into the accumulator 95.

As another example, a data output instruction may include transferring a RAM address from a field in the instruction to the RAM 83 via bus 85, transferring this addressed data from the RAM 83 via bus 85 to the output buffer 96 and thus out onto the external address-/data bus 7. Certain control outputs may be produced by memory control 99 on lines of the control bus 9 such as write enable, etc. The address for this data output could be an address on the bus 7 via buffer 96 in a previous cycle where it is latched in the memory 80 or memory 5 by an address strobe output from the memory control 99 to the control bus 9.

An external memory controller device may be used to generate the $\overline{RAS}$ and $\overline{CAS}$ strobes. A two-byte address for the memory 5 would be applied to the bus 7 in two machine cycles if the bus 7 is 8-bit, or in one cycle if the bus is 16-bit.

The instruction set of the microcomputer 8 includes instructions for reading from or writing into video memory 5, the additional memory 80 or the input/output ports of peripheral equipment 81, with the internal source of destination being the RAM 83, program counter 90, temporary registers 94, instruction register 87, etc. In a microcoded processor each such operation involves a sequence of states during which addresses and data are transferred on internal bus 85 and external bus 7.

Alternatively, the invention may use a microcomputer 8 of the non-microcoded type in which an instruction is executed in one machine state time. What is necessary in selecting the microcomputer 8 is that the data and addresses, and various memory controls, be available offchip, and that the data-handling rate be adequate to generate and update the video data within the time constraints of the particular video application.

The video memory arrangement of the invention is described in terms of one bit data paths for the bus 7, although it is understood that the microcomputer system and the memory technique is useful in either 8-bit or 16-bit systems, or other architectures such as 24-bit or 32-bit. One utility is in a small system of the type having 8-bit data paths and 12-bit to 16-bit addressing, in which no external memory is needed and the peripheral circuitry 81 consists of merely a keyboard or like interface, plus perhaps a disc drive. A bus interface chip such as an IEEE 488 type of device could be included in the peripheral circuitry 81, for example.

Figure 6:
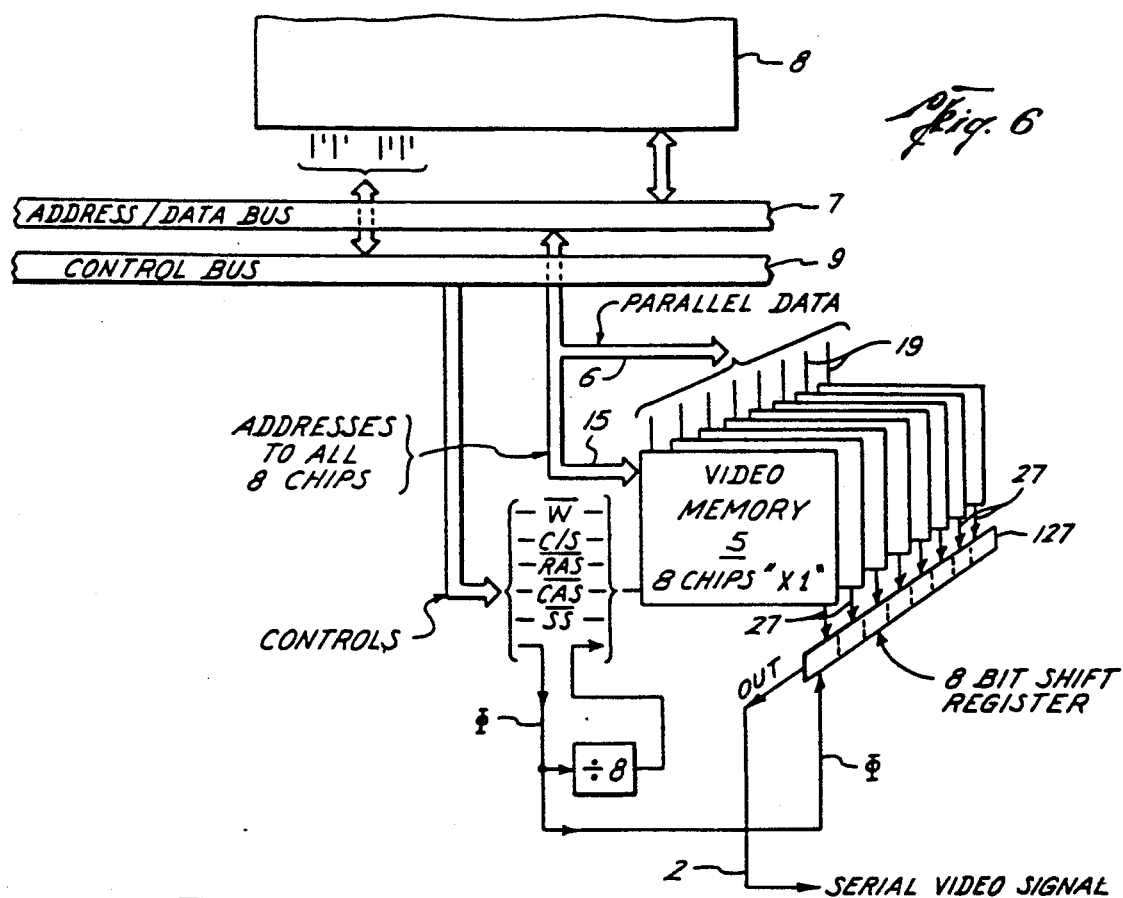
FIG. 6 is a block diagram of a further different portion of the system depicted in FIG. 1.

As illustrated in FIG. 6, the video memory 5 may be configured as eight ×1 memory devices, or alternatively as one ×8 device. In this embodiment eight semiconductor chip memories 5 are used, all eight being 64K×1 or perhaps 16K×1, each having corresponding on-chip multiple serial shift registers for serial access as in FIG. 2, with one bit wide input and output. For a full color television display 1, using 8-bits per tri-color dot, a memory system consisting of four banks (eight chips per bank) of 64K×1 memory devices would be required. Each line on the screen would use two 256-bit registers, clocked out one following the other, for each of eight video signal input lines 2 (instead of only one video data input 2 as shown).

The microcomputer 8 and bus 7 would access the 8-bit video data in parallel in a "×1" format on each chip by the eight data lines 6, one for each chip, as seen in FIG. 6. The address inputs 15 for all eight chips receive the same addresses from the bus 7, and all eight chips receive the same control inputs from bus 9. The eight serial outputs 27, one from each chip, are connected to respective bit positions of an eight-bit shift register 127.

The serial clock $\phi$ is divided by eight before application to the eight chips 5; the clock $\phi$ applied to the shift register 127 thus shifts out eight bits onto the video signal input line 2 and then another eight bits are loaded into shift register 127 from the serial shift registers 20 on the individual chips. Alternatively, instead of using the auxiliary shift register 127, the eight outputs 27 can be connected to eight parallel video signal inputs of the color TV.

An important feature of the invention for some systems is the serial data input 22 of FIG. 2. The serial input may be video data from a receiver or a video tape playback mechanism 105 shown in FIG. 7 supplying a continuous serial video feed on line 106 to the input 22 of a chip as in FIG. 2. This incoming video data is written into the cell array 10 from the serial register 20, and while in the RAM array it is processed by the microcomputer 8 using the parallel access port 19, and then supplied to the video signal line 2 via the serial shift register 20 and the serial data output terminal 27.

An example of one use of this arrangement is to add text or graphics via the microcomputer 8 on top of video supplied from the video receiver or tape recorder 105. Another example would be to enhance or correct the video from receiver or tape 105 by writing it serially into the array 10; reading the data out in parallel to store bits temporarily in the RAM 83 of the microcomputer, performing operations via the ALU 84, then writing the corrected data back into the array 10 via bus 7, from whence it is read out serially onto the video signal input 2.

The advantage of the system of the invention in this regard is that the desired portion of the register 20 can be serially loaded at the same time it is being serially read; that is, data-in and data-out overlap as seen in FIGS. 4d and 4e. During the 128, or fewer, clock cycles used for serial-in and serial-out, the array 10 can also be accessed in parallel by microcomputer 8 for the write-over, update or correction operation.

The semiconductor memory chip containing the array 10 may also include a conventional row address counter which generates an 8-bit row address for coupling to the input of the row decoders 12 by multiplex circuitry, so the row decoder can accept an address from either the address input terminals 15 via buffers 14 or from the counter. This counter may be self-incrementing so that a count of one is added to the existing count whenever an input command INC is received.

The counter may function as an onchip refresh address generator as set forth in U.S. Pat. Nos. 4,207,618 and 4,344,157, or as indicated in U.S. Pat. No. 4,333,167. A column address is not needed for refresh. When a row is addressed for serial-read or serial-write, this also refreshes the data in this row; likewise, a parallel access refreshes a row upon read or write. Thus, if the video data is being sampled via serial read at the usual rates needed for TV scan then each row is not addressed within the 4 msec refresh period (60 frames/second is about 17 msec between successive samplings).

During the time between serial reads, the microcomputer 8 will probably, but not necessarily, access all rows for parallel read or write often enough for refresh. Thus, the microcomputer program in the ROM 82 could include a counter loop to send out an incremented row address and $\overline{RAS}$ at some fixed rate to assure that the refresh address specifications are met. However, to avoid occupying the microcomputer program execution with refresh overload, the counter on the chip may provide the address on-chip, and the microcomputer 8 need only apply the $\overline{RAS}$ control. That is, upon receipt of $\overline{RAS}$ and no $\overline{CAS}$, with write command $\overline{W}$ and $\overline{TR}$ high, the multiplex is switched to apply the contents of the counter to the row decoder 12, and write command $\overline{W}$ is activated to refresh a row; no serial or parallel data in or out is initiated.

An INC command may be produced to increment the counter for the next refresh. Further, an on-chip refresh signal may be generated on-chip from a timer, as in U.S. Pat. No. 4,344,157, for example. The timer produces a refresh command at least once every (4 msec.)×(1/256)=16 microsec. This refresh command activates the input multiplexer, write command $\overline{W}$ and INC command just as the off-chip refresh request previously discussed.

The serial input and output via register 20, in most uses such as video, will require access to sequential rows. Thus, an on-chip 8-bit counter may be employed to avoid the necessity of applying a row address from the microcomputer 8 for serial access. If the sampling rate is high enough, this may be the same as the refresh counter; i.e., only one counter is needed as no separate provision for refresh is necessary.

Figure 8:
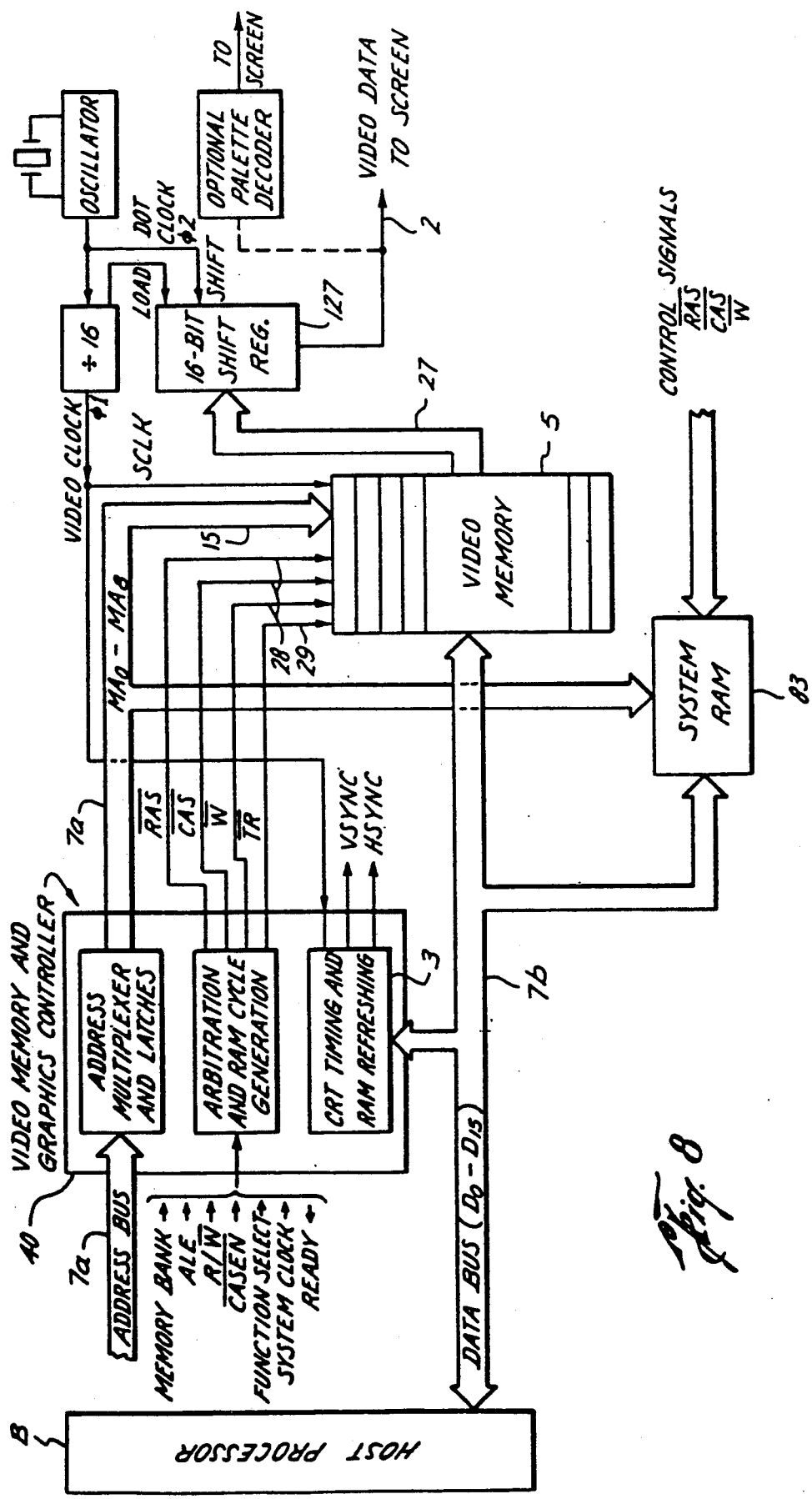
FIG. 8 is a block diagram of a further different embodiment of the system depicted in FIG. 7.

Referring now to FIG. 8, a relatively complete video graphics subsystem employing the video memory 5 of the present invention, and a memory and graphics controller 40 is depicted. The memory and graphics controller would replace the conventional separate controllers needed for the video and main system memories and it may also be designed to generate the synchronization and blanking signals that are required by the display circuitry.

Each horizontal display scan is made up of an active display scan, during which data is sent out, and a retrace scan, when no data is required. During the retrace scan the serial shift registers 20 of the present invention may be reloaded from the memory array 10. The memory and graphics controller 40 could be designed with counters to keep track of the pixel and line position on the screen so that the proper address and reloading information can be sent to the device automatically during the retrace period. This controller could also be designed with enough intelligence to handle interlaced or non-interlaced displays.

The use of this invention with such a graphics controller reduces the amount of external circuitry needed to control the video memory 5 and simplifies the signals the microcomputer 8 must generate to control the video display. Further, use of larger volume storage devices allows the use of a "standard" package of a graphics controller and video memory for CRT screens of different sizes and resolutions.

Another feature of the invention is that the shift clock $\phi$ may be generated separate from the microcomputer 8. Note that serial access and parallel access to the array 10 via register 20 and line 19 may be asynchronous; that is, the shift clock $\phi$ generator need not be synchronized with the clock of the microcomputer 8, but instead may be synchronized with the video display 1 of FIG. 1 or the video signal 106 from receiver 105 of FIG. 7.

Figure 7:
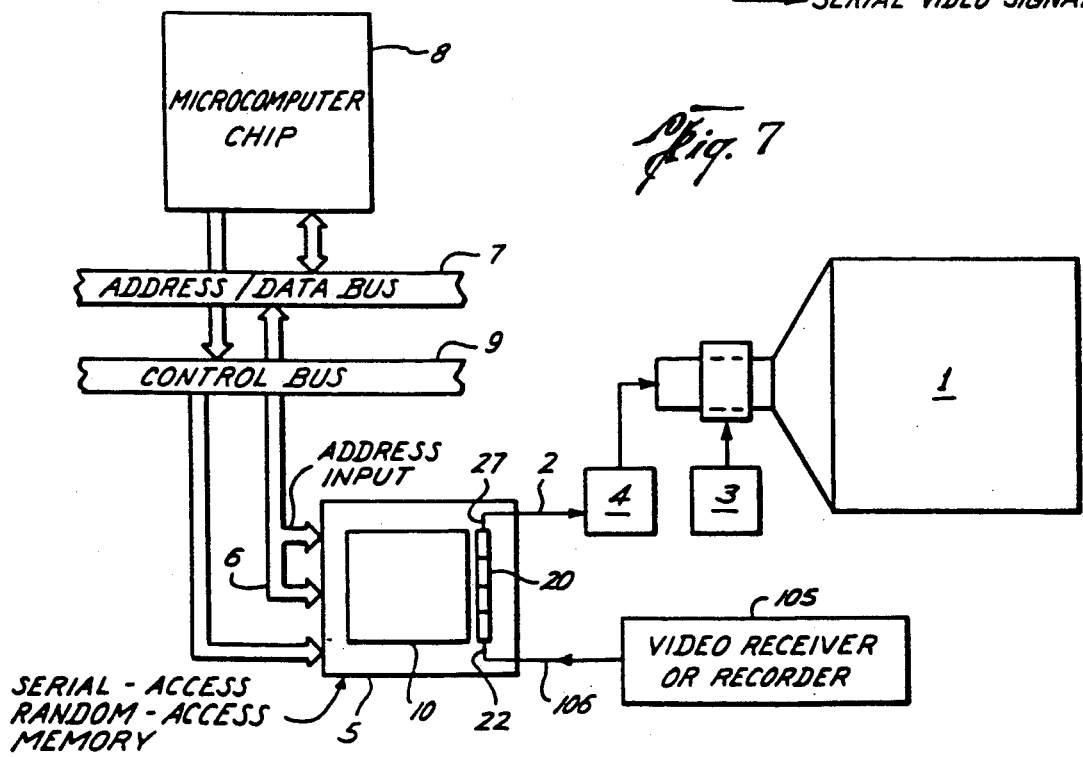
FIG. 7 is a block diagram of another different embodiment of the system depicted in FIG. 1.

A system that advantageously utilizes these features of the embodiment of FIG. 7, with serial input is an interactive home TV adapted for games, education use or catalog ordering, as examples. That is, a encoded video background is fed into serial input 22 from cable or VCR, and the user superimposes his variable added data input via microcomputer 8 (employing a keyboard, joystick, or the like coupled via peripheral input/output 81 of FIG. 5), and the resulting composite video data is applied to the screen 1 via line 2. This same video data, or alternatively only the variable added data, may be retransmitted via cable or rf to the originator for applications such as catalog ordering, bank-by-cable, educational test scoring, etc.

Figure 9:
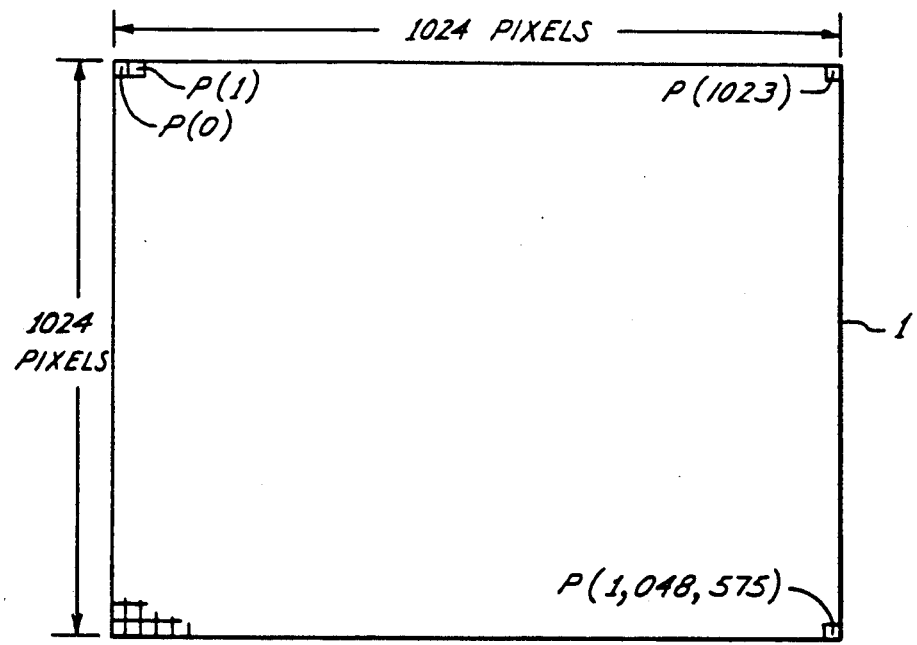
FIG. 9 is a simplified depiction of a video screen suitable for the purposes of the present invention and having 1024 by 1024 pixels.
Figure 10:
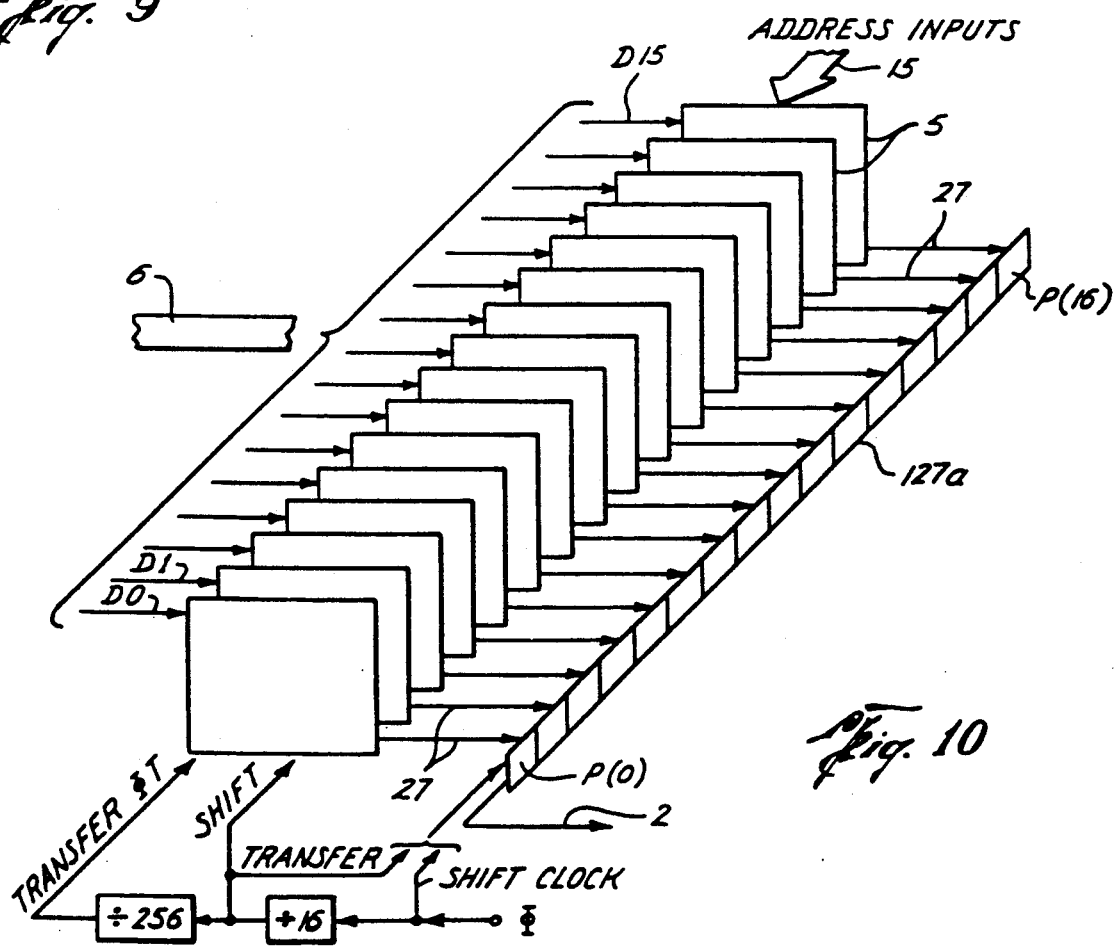
FIG. 10 is a simplified functional diagram of a portion of the system depicted in FIG. 1 according to another embodiment of the invention.

In typical video applications, the transfer of data from the array 10 into the serial shift register 20 occurs during the blanked (no data) retrace period. For a high resolution non-interlaced 1024 lines by 1024 pixels per line, simple black and white CRT screen, as depicted in FIG. 9, this will require sixteen of the 64K devices in parallel, as depicted in FIG. 10. For most applications the devices' serial shift registers 20 will feed their output in parallel into a main video shift register 127 which clocks the data out at the dot or pixel clock speed, i.e. cursor sweep speed.

For the CRT of FIG. 9 the noninterlaced pixel sweep speed or dot clock rate is 12 nsec. However, the video memories of FIG. 10 transfer their outputs to the main shift register 127 once every 16 dot clock cycles and the video memories therefore shift their data every 192 nsec, which is much slower than serial shift register 20 speed of the device, which is about 40 nsec. Sixteen devices are selected to be used so that a standard 16 lead address and memory bus, as well as 16 bit microprocessor may be employed. However, this arrangement simplifies the controller circuitry and reduces the display memory to only sixteen parts while ensuring compatability with a 16-bit processor. Although for data storage requirements, only 4 of these 64K devices in a by 4 mode could be used, or larger volume devices in various modes could also be used.

Figure 11:
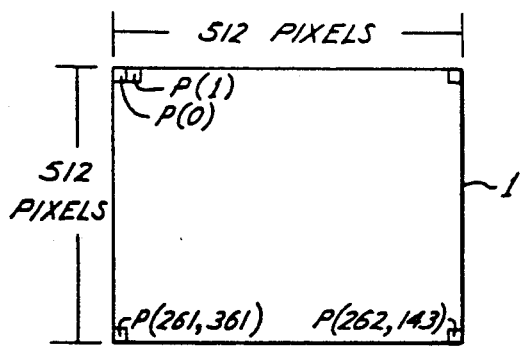
FIG. 11 is a simplified depiction of a video screen suitable for the purposes of the present invention and having 512 by 512 pixels for color presentations.
Figure 12:
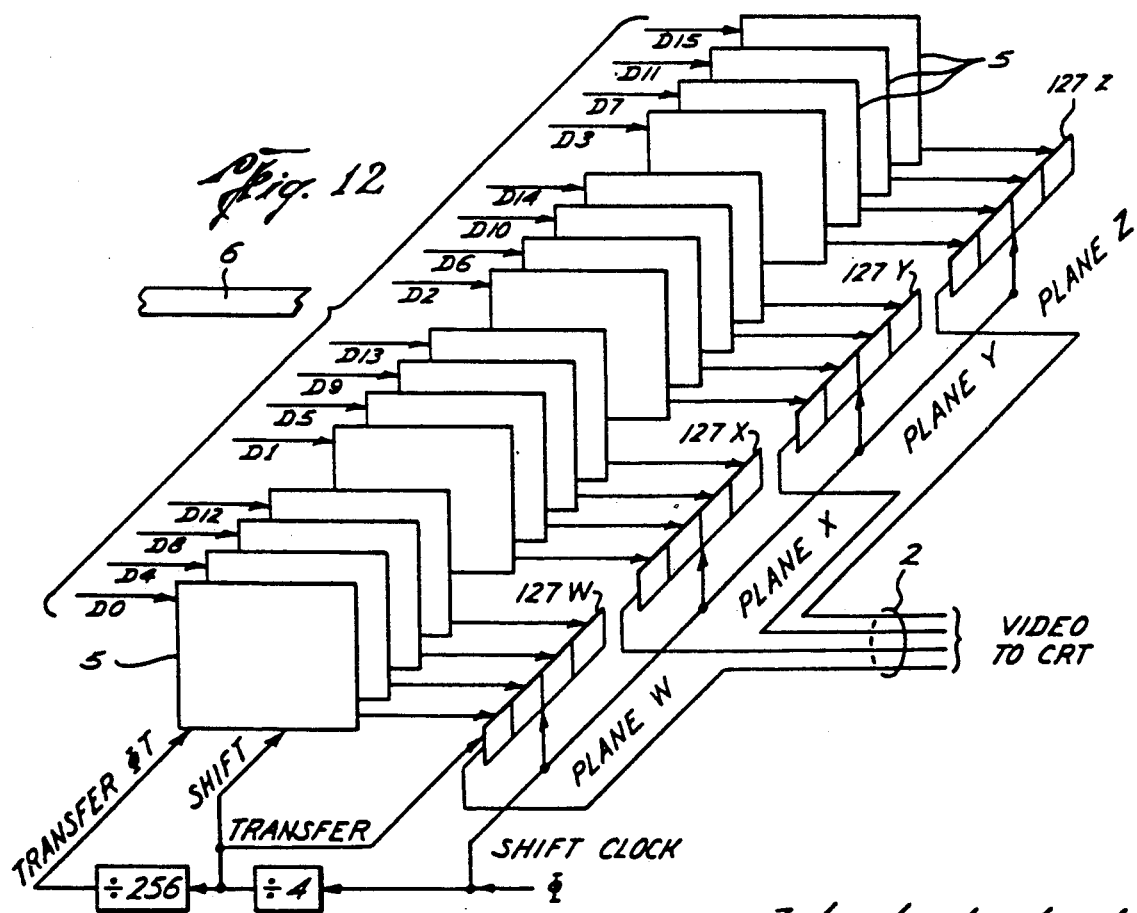
FIG. 12 is a functional diagram of a portion of the system depicted in FIG. 1 according to another different embodiment of the invention.
Figure 13:
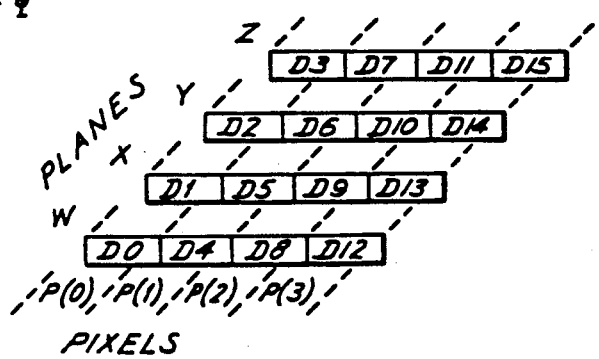
FIG. 13 is a simplified representation of the correspondence between color planes and pixels for the purpose of the structures in FIG. 12.

For a 512 lines by 512 pixels per line, four plane color system, the CRT is depicted in FIG. 11, and the arrangement of the memory devices in FIG. 12 and the correspondance of planes to pixels in FIG. 13. FIGS. 11, 12 and 13 depict a bit-mapped raster scan color graphics medium resolution system for a 512 lines by 512 pixels per line which requires 4 bits per pixel to obtain 16 color choices. The sixteen video memory devices 5 are organized as four banks or planes of four cascaded chips, with each bank or plane linked to an external 4-bit shift register 127.

On every shift out operation, the registers 127 supply one bit of the 4-bit combination necessary to describe the color of the corresponding pixel. These 4-bit words are then sent to a color look up table or other video circuitry. To do the proper pixel mappings the host processor's data bus, which sends information to the storage devices, must be reorganized to make sure that the 4-bits, coming out of the external 4-bit shift registers, correspond to the same pixel. Also note that the cycle times of the devices on-chip serial shift registers 20 increases by a factor of four, since the 4-bit external shift registers must be reloaded every 4 pixel clock intervals, rather than the 16 pixel clock intervals of FIGS. 9 and 10. However, this speed is still within the speed limitations of the on-chip serial shift register.

The concepts of the invention are useful in communications systems other than video. For example, multiplexed voice (telephone) or digital data is transmitted serially at very high bit rates via microwave or fiber optic transmission channels. This data is similar in format to the serial video data in line 2 or line 106 in FIG. 7. Accordingly, the memory device 5 as described above is very useful in processing this type of data. The data is written into the memory 5 from the communications link by the serial, sequentially-addressed (auto increment) port, and/or read from the memory 5 to the communications link by this port. That is, the memory 5 and microcomputer 8 can be part of a receiver, a transmitter, a relay station, or a transceiver. Once in the array 10 of the memory 5, the data is accessed in parallel in random fashion by the microcomputer 8 for utilization by D-to-A converters for telephone systems, by error detection and correction algorithms, demultiplexing or multiplexing various channels, station-select, encrypting or decoding, conversion to formats for local area networks, and the like.

Another use of the concepts of the invention is in a microcomputer system employing a magnetic disc for bulk storage. For example, the so-called Winchester disc provides several megabytes of storage which is accessed serially at bit rates of many megabits/second, similar to the video data rates of FIG. 7. Programs can be downloaded from disc to memory 5 in large blocks of 64K-bytes or 128K-bytes, then the microcomputer executes from the memory until a given task is completed or interrupted. The contents of memory 5 can be read out and sent to the disc storage via line 2 while another block is being written into memory 5 via input 22.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A storage device adapted for both random access and serial access modes of operation and responsive to a first signal, a second signal and a third signal, the storage device comprising:
   a memory array having cells interconnected in rows and columns selectable in response to said first signal and said second signal,
   register means having a plurality of bit positions selectively interconnectable with said columns of said memory array in response to said third signal and having a plurality of taps adjacent preselected bit locations therealong, and
   tap selection means interconnected for selecting one of said taps in conjunction with said second signal.

2. The storage device described in claim 1, wherein said second signal that said tap selection means are responsive to includes an address signal and a selection signal.

3. The storage device described in claim 2, further including serial output means interconnectable with said selected tap.

4. The storage device described in claim 3, further comprising
   row address means functionally interconnected with said rows of cells in said memory array and responsive to said first signal for addressing and selecting one of said rows of cells, and
   column address means functionally interconnected with said columns of cells in said memory array and said tap selection means for addressing and selecting one of said columns of cells.

5. The storage device described in claim 4, wherein said first signal includes a row address signal and a row selection signal and said second signal includes a column address signal and a column selection signal.

6. The storage device described in claim 5, wherein said row address means are responsive to said row address signal and said row selection signal and said column address means and said tap selection means are responsive to said column address signal and said column selection signal.

7. The storage device described in claim 6, wherein said row address means are interconnected for addressing said rows of cells in said memory array in response to said row address signal and said column address means are interconnected for addressing said columns of cells in said memory array and said tap selection means in response to said column address signal.

8. The storage device described in claim 7, wherein said row address means are responsive to said row selection signal for selecting one of said rows of cells and said column address means are responsive to said column selection signal for selecting one of said columns of cells.

9. The storage device described in claim 8, wherein said tap selection means are responsive to said column selection signal for selecting one of said taps on said register means.

10. The storage device described in claim 9, wherein said column address means are responsive to said column address signal and said column selection signal when said memory array is in a random-access mode and said tap selection means are responsive to said column address signal and said column selection signal when said storage device is in a serial mode.

11. A dual port memory circuit having provision for both serial and random access, comprising
- a memory component having a plurality of cells arranged in rows and columns interconnected by lines therein,
- a serial register means having a plurality of bit positions each corresponding to and interconnectable with one of said column lines in said memory component,
- a plurality of taps each interconnected with said register means at a different one of said bit positions thereon,
- row address means interconnected with said memory component for selecting one of said row lines therein,
- column address means interconnected with said memory component for selecting one of said column lines or one of said taps, and
- output terminal means interconnected with said register means at a selected one of said taps in response to said column address means.

12. An improved video-type computer system, comprising
- a data processing circuit for generating video data bits and a column address signal,
- a memory circuit having a plurality of cells interconnected in rows and columns and responsive to said column address signal for receiving said video data bits,
- a shift register having a plurality of bit positions for receiving stored video data bits from related columns of cells in said memory circuit,
- a plurality of taps each interconnected with said shift register at preselected bit positions, and
- selection means responsive to said column address signal for selecting one of said taps and unloading video data bits from a functionally related portion of said shift register.

13. The computer system described in claim 12, wherein said selection means selects said one tap and unloads the video data bits from said related portion of said shift register when said memory circuit is in serial mode.

14. The computer system described in claim 13, wherein said data processing circuit also generates a control signal for interconnecting said bit positions in said shift register to said related columns of cells in said memory circuit.

15. A memory device having both random access and serial access modes of operation, the memory device comprising;
- a memory array including a plurality of storage cells arranged in addressable rows and columns for storing a bit of data in each storage cell,
- a register having a plurality of storage positions for selectively connecting with the columns of storage cells of the memory array to transfer bits of data between the storage cells of the memory array and the storage positions of the register and having a plurality of taps, each tap being adjacent to a different one of the storage positions, and
- a tap selector responsive to addresses for selectively coupling the plurality of taps with a terminal for transferring sequences of bits of data from the storage position adjacent the interconnected tap to the terminal.

16. A memory device, in accordance with claim 15, further comprising;
- a row address circuit, responsive to addresses, for accessing one row of storage cells of the memory array at a time,
- a column address circuit responsive to addresses, for accessing either one column of storage cells of the memory array or one tap adjacent a storage position of the register at a time.

17. A memory device, in accordance with claim 16, wherein
the one tap is selected for serial access of data from the register to the terminal in response to a column address signal and a column access strobe signal applied to the column address circuit.

18. A memory device, in accordance with claim 15, further comprising:
- a transfer circuit interposed between the columns of storage cells and the register for selectively connecting the storage positions of the register with the columns of storage cells in response to a control signal.

19. A dual port memory circuit arranged for both serial access and random access, the memory circuit comprising:
- a memory component having an array including a plurality of cells arranged in rows and columns,
- a serial register having a plurality of storage elements, each corresponding to one of the columns of the array, the plurality of storage elements being selectively connectable to the columns of cells,
- a plurality of taps, each interconnected with a different storage element of the serial register,
- a row address circuit interconnected with the array for accessing a selected one of the rows of cells,
- a terminal, and
- a column address circuit interconnected with the memory component either for randomly accessing a selected one of the columns of cells or for selecting one of the taps for coupling a serial stream of data to the terminal.

20. A dual port memory circuit, in accordance with claim 19, further comprising:
- a transfer circuit interposed between the columns of cells and the serial register for selectively connecting the storage elements of the serial register with the columns of cells in response to a control signal.

21. A dual port memory circuit, in accordance with claim 19, wherein
the one tap is selected in response to a column address signal and a column access strobe signal applied to the column address circuit.

22. A video display system comprising:
- a data processor generating row addresses, column addresses, control signals and data bits representing an image,
- a display device responsive to video signals for producing a visual image, a dual port memory device arranged for both random and serial access for inputting data bits and outputting data bits, the memory device including
a plurality of cells arranged in rows and columns,
a serial register having a plurality of storage elements, each storage element corresponding to one of the columns of the memory components, and having a plurality of taps, each tap associated with a different one of the storage elements,
a row address circuit interconnected with the rows of cells for accessing a selected one of the rows of cells for writing or reading of data,
a column address circuit interconnected with the columns of cells for randomly accessing data stored in a selected column of cells and interconnected with the taps for serial access of the data stored in the serial register commencing at a selected storage element, and
a video signal shaping circuit, responsive to the serial data from the serial register, for producing the video signal and applying the video signal to the display device.

23. A video display system, in accordance with claim 22, further comprising:
a transfer circuit interposed between the columns of cells and the serial register for selectively connecting the storage elements of the serial register to the columns of cells in response to a control signal.

24. A video display system, in accordance with claim 22, wherein
the columns of cells are randomly accessed in response to a column address signal and a column access strobe signal applied to the column address circuit.

25. A video display system, in accordance with claim 22, wherein
a single tap is selected for serial access of data in response to a column address signal and a column access strobe signal applied to the column address circuit.

26. A storage device adapted for both random access and serial access modes of operation and responsive to a row address signal, a row access strobe signal, a column address signal, a column access strobe signal, and a transfer signal, the storage device comprising:
a memory array having cells arranged in addressable rows selectable in response to said row address signal, and said row access strobe signal and in addressable columns selectable in response to said column address signal and said column access strobe signal;
register means having a plurality of bit positions which are interconnectable with or disabled from connecting with said columns of said memory array in response to states of said transfer signal and having a plurality of taps adjacent preselected bit locations therealong; and
tap selection means interconnected with the register means for selecting one of said taps in conjunction with said column address signal and said column access strobe signal.

27. A storage device described in claim 26 further comprising
serial output means interconnectable with said selected tap.

28. A dual port memory circuit arranged for both serial access and random access, the memory circuit comprising:
a memory array having a plurality of cells arranged in addressable rows and columns;
a register having a plurality of storage elements, each storage element corresponding to one of the columns of the memory array, the plurality of storage elements being selectively connectable to the columns of cells;
a row address circuit interconnected with the memory array for randomly accessing a selected one of the rows of cells;
a column address circuit interconnected with the memory array for randomly accessing a selected one of the columns of cells;
a terminal interconnected with the register for writing a serial stream of data into the register;
the row address circuit accessing a first selected row of cells for storing the serial stream of data from the register; and
the row address circuit accessing a second selected row of cells for storing the same serial stream of data from the register without rewriting the serial stream of data into the register.

29. A memory circuit comprising:
a memory array having a plurality of cells arranged in addressable rows and columns;
a register having a plurality of storage elements, each storage element corresponding to one of the columns of the memory array, the plurality of storage elements being selectively connectable to the columns of cells;
a row address circuit interconnected with the memory array for randomly accessing a selected one of the rows of cells;
a column address circuit interconnected with the memory array for randomly accessing a selected one of the columns of cells;
the row address circuit accessing a first selected row of cells for transferring the selected row of data out of the cells into the register; and
the row address circuit accessing a second selected row of cells for transferring the data from the register into the second selected row of cells.

30. A video display system comprising:
a data processor generating row addresses, column addresses, control signals, and data bits representing an image;
a display device responsive to a serial sequence of data bits for producing a visual image;
a dual port memory device arranged for both random access for inputting data bits from the data processor and serial access for outputting data bits to the display device, the memory device including:
an array of storage cells positioned in addressable rows and columns;
a register including a plurality of storage elements and a plurality of taps;
a transfer circuit, responsive to a transfer signal, for enabling coupling between the storage elements and the storage cells;
row access circuitry, accessed contemporaneously with the transfer circuit, for transferring data bits from a row of storage cells to the storage elements;
tap access circuitry, responsive to a column address and a column address strobe, for selecting one of the taps for coupling the register to the display device; and the register responsive to a clock signal for delivering a serial sequence of the data bits from the register by way of the selected tap to the display device for producing the visual image.

31. A memory arrangement comprising:

an array of storage cells positioned in addressable rows and columns;

a register including a plurality of storage elements and a plurality of taps;

a transfer circuit, responsive to a transfer signal, for enabling coupling between the storage elements and the storage cells;

row access circuitry accessed contemporaneously with the transfer circuit for transferring data from a row of storage cells to the storage elements;

tap access circuitry, responsive to a column address and a column address strobe, for selecting one of the taps for coupling the register to a serial data terminal; and the register responsive to a clock signal for delivering a serial sequence of data by way of the selected tap to the serial data terminal.

32. A memory arrangement, in accordance with claim 31, further comprising:

column access circuitry, operating in concert with the row access circuitry and concurrently with the delivery of the serial sequence of data to the serial data terminal, for randomly accessing a selected one of the storage cells for a read or a write operation.

* * * * *